(12) United States Patent
Enokido et al.

(10) Patent No.: US 9,159,572 B2
(45) Date of Patent: Oct. 13, 2015

(54) METHOD OF PRODUCING SEMICONDUCTOR SUBSTRATE PRODUCT, AND ETCHING METHOD TO BE USED THEREIN

(71) Applicant: FUJIFILM Corporation, Minato-ku, Tokyo (JP)

(72) Inventors: Masashi Enokido, Shizuoka (JP); Tadashi Inaba, Shizuoka (JP); Atsushi Mizutani, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/316,327

(22) Filed: Jun. 26, 2014

(65) Prior Publication Data

US 2014/0308819 A1    Oct. 16, 2014

Related U.S. Application Data

(63) Continuation of application No. PCT/JP2012/083673, filed on Dec. 26, 2012.

(30) Foreign Application Priority Data

Dec. 27, 2011 (JP) ................. 2011-286576

(51) Int. Cl.
*H01L 21/306* (2006.01)
*H01L 21/308* (2006.01)
(Continued)

(52) U.S. Cl.
CPC .... *H01L 21/30608* (2013.01); *H01L 21/02068* (2013.01); *H01L 21/3081* (2013.01); *H01L 21/32134* (2013.01); *H01L 28/92* (2013.01); *H01L 27/10852* (2013.01)

(58) Field of Classification Search
CPC ...................... H01L 21/3081; H01L 21/30608
USPC .................... 438/753, 243, 386, 256
See application file for complete search history.

(56) References Cited

U.S. PATENT DOCUMENTS 7,067,385 B2    6/2006  Manning
2001/0049182 A1    12/2001  Urakami et al.
(Continued)

FOREIGN PATENT DOCUMENTS

JP    02-251275 A    10/1990
JP    2000-286229 A    10/2000
(Continued)

OTHER PUBLICATIONS

Guizhen et al. ("An Improved TMAH Si-etching solution without Attacking Exposed Aluminum" Sensors and Actuators A 89 (2001) pp. 135-141).*

(Continued)

*Primary Examiner* — Duy Deo
*Assistant Examiner* — Mahmoud Dahimene
(74) *Attorney, Agent, or Firm* — Sughrue Mion, PLLC

(57) ABSTRACT

A method of producing a semiconductor substrate product, the method containing: a step of preparing an aqueous solution containing 7% by mass or more and 25% by mass or less of a quaternary alkyl ammonium hydroxide; a step of preparing a semiconductor substrate having a silicon film comprising a polycrystalline silicon film or an amorphous silicon film; and a step of heating the aqueous solution at 80° C. or higher and applying the resultant aqueous solution onto the semiconductor substrate to etch at least a part of the silicon film.

21 Claims, 3 Drawing Sheets

(51) Int. Cl.
*H01L 49/02* (2006.01)
*H01L 21/02* (2006.01)
*H01L 21/3213* (2006.01)
*H01L 27/108* (2006.01)

(56) References Cited

U.S. PATENT DOCUMENTS

| | | | |
|---|---|---|---|
| 2006/0046419 A1* | 3/2006 | Sandhu et al. | 438/386 |
| 2006/0073659 A1* | 4/2006 | Sell et al. | 438/256 |
| 2008/0305604 A1* | 12/2008 | Lin | 438/386 |
| 2009/0258469 A1 | 10/2009 | Ueda | |

FOREIGN PATENT DOCUMENTS

| | | | | |
|---|---|---|---|---|
| JP | 2000-286229 | * | 9/2001 | H01L 21/306 |
| JP | 2001-267290 | * | 9/2001 | H01L 21/306 |
| JP | 2001-267290 A | | 9/2001 | |
| JP | 2001-351865 | * | 12/2001 | H01L 21/205 |
| JP | 2001-351865 A | | 12/2001 | |
| JP | 2005-045285 A | | 2/2005 | |
| JP | 2005-191163 A | | 7/2005 | |
| JP | 2006-054363 A | | 2/2006 | |
| JP | 2006-351813 A | | 12/2006 | |
| JP | 2007-534145 A | | 11/2007 | |
| JP | 2008-085164 A | | 4/2008 | |
| JP | 2009-259949 A | | 11/2009 | |
| JP | 2010-135591 A | | 6/2010 | |
| JP | 2012-199521 A | | 10/2012 | |

OTHER PUBLICATIONS

Jiunn-Jye Tsaur et al., "Investigation of TMAH for front-side bulk micromachining process from manufacturing aspect," Sensors and Actuators A, 2001, pp. 375-383, vol. 92.

International Search Report of PCT/JP2012/083673 dated Mar. 19, 2013.

Communication dated Feb. 3, 2015 from the Japanese Patent Office in counterpart application No. 2012-286106.

* cited by examiner

METHOD OF PRODUCING SEMICONDUCTOR SUBSTRATE PRODUCT, AND ETCHING METHOD TO BE USED THEREIN

CROSS-REFERENCE TO RELATED APPLICATIONS

This application is a Continuation of PCT International Application No. PCT/JP2012/083673 filed on Dec. 26, 2012, which claims priority under 35 U.S.C. §119(a) to Japanese Patent Application No. 2011-286576 filed on Dec. 27, 2011. Each of the above applications is hereby expressly incorporated by reference, in its entirety, into the present application.

TECHNICAL FIELD

The present invention relates to a method of producing a semiconductor substrate product, and an etching method to be used therein.

BACKGROUND ART

A concave type structure has been conventionally employed for the capacitor structure in a dynamic random access memory (DRAM). In this structure, a lower electrode film is formed inside a cylinder bore, and only the inner surface is made to function as an electrode. According to this structure, the area occupied by the capacitor can be certainly made small. The diameter of the cylinder bore is however necessarily decreased. Besides, it is necessary to secure the capacitance needed for the device operation of the DRAM. In order to satisfy these two requirements, the depth of the cylinder bore is further deepened. As such, that would make more difficult appropriately to cope with the production of capacitors in terms of microprocessing technology.

Attempts have been made to control the aspect ratio of the capacitor structure, but the process per se is not so simple as to forming a fine cylinder structure or a bore therein with high accuracy. Usually, this process is carried out by wet etching. That is, in order to leave a tubular structure having a cylinder wall with a nanometer to submicrometer size with a certain depth in a semiconductor substrate, the material inside and outside the tubular structure should be removed using an etching liquid. In particular, removal of the material inside the cylinder bore or between the cylinder structures must be done in a manner such that the material is scraped out of an enclosed space. The removal of material hence involves difficulties in a processing carried out by wet etching.

CITATION LIST

Patent Literatures

Patent Literature 1: JP-A-2006-351813 ("JP-A" means unexamined published Japanese patent application)
Patent Literature 2: JP-A-2006-054363

DISCLOSURE OF INVENTION

Technical Problem

There are examples of proposals for a single-crystalline silicon etching liquid which is composed mainly of an alkali compound (see Patent Literatures 1, 2 and the like). However, exemplified study has not been carried out on removal properties of the polycrystalline silicon film or the amorphous silicon film. A new research and development has been thus desired.

In recent years in particular, confronting a request of improving efficiency in structuring the semiconductor device, speeding-up of etching has be risen to an indispensable object. An increase in alkalinity may be considered with use of a solution of an alkali metal hydroxide such as KOH. This can achieve higher-speed etching. However, it is concerned that the alkali metal may bring about deteriorating performances of the semiconductor device, and therefore if possible, the use thereof as a production material is to be avoided. In view of the situation regarding the etching of a polycrystalline silicon or an amorphous silicon each of which has many unknown matters as described above, the present invention addresses the provision of a method of producing a semiconductor substrate product using a high-speed and precise (defect-reduced) etching, which can be accomplished possibly by a simple constitution, without containing an alkali metal as an essential component. Further, the present invention addresses the provision of an etching method to be used therein.

Solution to Problem

The problems of the present invention can be solved by the following means.

[1] A method of producing a semiconductor substrate product, the method comprising:
a step of preparing an aqueous solution containing 7% by mass or more and 25% by mass or less of a quaternary alkyl ammonium hydroxide;
a step of preparing a semiconductor substrate having a silicon film comprising a polycrystalline silicon film or an amorphous silicon film; and
a step of heating the aqueous solution at 80° C. or higher and applying the resultant aqueous solution onto the semiconductor substrate to etch at least a part of the silicon film.

[2] The method of producing a semiconductor substrate product as set forth in the item [1], wherein a temperature of the aqueous solution is set to 90° C. or higher.

[3] The method of producing a semiconductor substrate product as set forth in the item [1] or [2], wherein the semiconductor substrate comprises a Ti compound, and a portion of the silicon film is etched selectively to the Ti compound.

[4] The method of producing a semiconductor substrate product as set forth in any one of the items [1] to [3], wherein the aqueous solution comprises only one kind of the quaternary alkyl ammonium hydroxide.

[5] The method of producing a semiconductor substrate product as set forth in any one of the items [1] to [4], wherein the aqueous solution is applied onto the silicon film comprising a polycrystalline silicon film or an amorphous silicon film which is not yet subjected to a removal treatment of an oxide-film.

[6] The method of producing a semiconductor substrate product as set forth in any one of the items [1] to [5], wherein a concave-convex shape that constitutes a capacitor is formed by removing a part or all of the silicon film.

[7] The method of producing a semiconductor substrate product as set forth in any one of the items [1] to [6], wherein application of the aqueous solution onto the silicon film is carried out in an inert atmosphere.

[8] The method of producing a semiconductor substrate product as set forth in the item [6] or [7], wherein a cylinder structure having an aspect ratio (depth/opening breadth) of 15 to 100 is formed as the concave-convex shape.

[9] The method of producing a semiconductor substrate product as set forth in any one of the items [1] to [8], wherein the quaternary alkyl ammonium hydroxide comprises a compound containing 3 or more methyl groups or ethyl groups.
[10] The method of producing a semiconductor substrate product as set forth in any one of the items [1] to [9], wherein a metal masking agent is contained in an amount of from 0.0001 to 0.1% by mass.
[11] The method of producing a semiconductor substrate product as set forth in any one of the items [1] to [10], wherein the above-described etching is carried out after a cleaning step of the semiconductor substrate with ultrapure water, a removal step of a silicon oxide film, and a follow-up cleaning step of the semiconductor substrate with the ultrapure water.
[12] The method of producing a semiconductor substrate product as set forth in the item [11], wherein an aqueous cleaning with warmed ultrapure water is carried out after the removal step of the silicon oxide film.
[13] The method of producing a semiconductor substrate product as set forth in the item [11] or [12], wherein a wafer is pre-heated after the follow-up cleaning step with the ultrapure water, and then subjected to etching.
[14] The method of producing a semiconductor substrate product as set forth in any one of the items [11] to [13], wherein nitrogen-substituted ultrapure water is used in the cleaning step.
[15] The method of producing a semiconductor substrate product as set forth in any one of the items [1] to [14], wherein application of the aqueous solution onto the silicon film is carried out by any of the following processes A and B.
[A: discharging the aqueous solution having a specific temperature in a heating tank and/or by an inline system thereby bringing the solution into contact with the silicon film]
[B: setting the aqueous solution in a bath to a specific temperature and immersing a silicon film in the aqueous solution thereby bringing the solution into contact with the silicon film]
[16] The method of producing a semiconductor substrate product as set forth in the item [15], wherein etching is carried out at 1,000 rpm or more of number of revolutions of the semiconductor substrate in the process A.
[17] The method of producing a semiconductor substrate product as set forth in the item [16], wherein etching is carried out while translating a chemical liquid nozzle by 2 cm or more from a center of the semiconductor substrate at a rate of 20 reciprocation/min or more in the process A.
[18] The method of producing a semiconductor substrate product as set forth in any one of the items [1] to [17], wherein a temperature of the aqueous solution is controlled by a tank temperature or a wafer surface temperature.
[19] The method of producing a semiconductor substrate product as set forth in any one of the items [1] to [18], wherein a concentration of the quaternary alkyl ammonium hydroxide in the aqueous solution is set to 18% by mass or lower.
[20] The method of producing a semiconductor substrate product as set forth in any one of the items [1] to [19], wherein a ratio (ERs/ERe) of an etching rate (ERs) of the silicon film to an etching rate (ERe) of a titanium compound is set to 100 or more.
[21] The method of producing a semiconductor substrate product as set forth in any one of the items [1] to [20], comprising:
a step of forming a multilayer film structure including a silicon film, and forming a concave-convex in the semiconductor substrate, in a step of preparing the semiconductor substrate, then a step of forming a conductive film at least on the upper surface of a concave-convex surface and on the wall surface of a concave portion;
a step of applying an embedded film onto the conductive film to fill the concave portion with the embedded film; and
a step of removing a part of the conductive film portion applied on the upper surface and the embedded film to expose the silicon film of the semiconductor substrate, and thereafter,
a step of applying the aqueous solution onto the semiconductor substrate to remove the exposed silicon film and the embedded film while leaving the conductive film on the wall surface of the concave portion, as the etching step of the silicon film.
[22] An etching method comprising:
a step of preparing an aqueous solution containing 7% by mass or more and 25% by mass or less of a quaternary alkyl ammonium hydroxide; and
a step of heating the aqueous solution at 80° C. or higher and applying the resultant aqueous solution onto a polycrystalline silicon film or an amorphous silicon film to remove at least a part of the film.
[23] The method as set forth in any one of the items [1] to [22], wherein the aqueous solution does not substantially contain hydroxylamine (HA).

Advantageous Effects of Invention

According to the method of producing a semiconductor substrate product and the etching method of the present invention, an amorphous silicon film or a polycrystalline silicon film can be etched at high speed with precision, and if needed, prolonging a solution life, without an etching liquid containing, as an essential component, an alkali metal which has concerns about deterioration in performance of the semiconductor device. Further, according to the present invention, high-speed etching can be achieved, capable of realizing the above-described high-quality in production, by very simple elements. Especially, the present invention can bring about an advantage of being adapted to a formation of a capacitor structure having a concave-convex shape.

Other and further features and advantages of the invention will appear more fully from the following description, appropriately referring to the accompanying drawings.

MODE FOR CARRYING OUT THE INVENTION

[Formation of Capacitor Structure]

Figure 1:
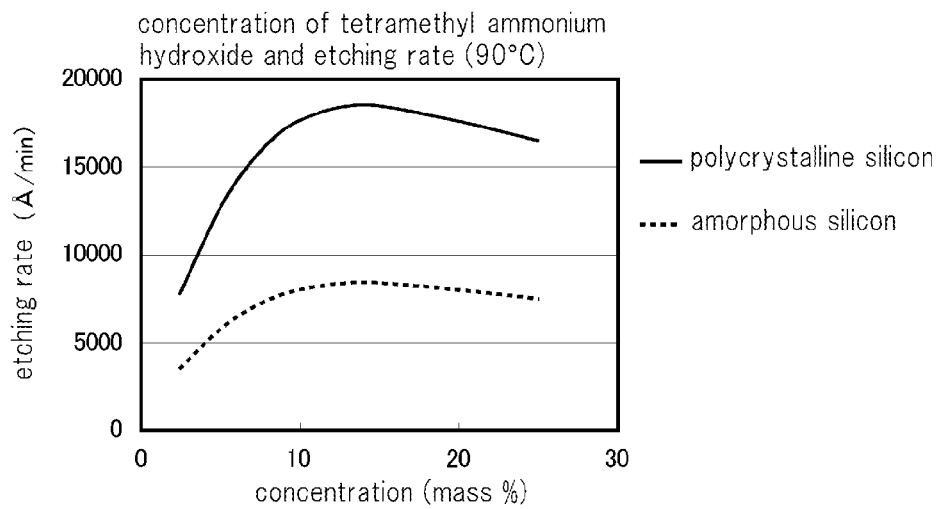
FIG. 1 is a graph showing changes of etching rate due to concentrations of the specific component of the etching liquids used in Examples and Comparative Examples.
Figure 2:
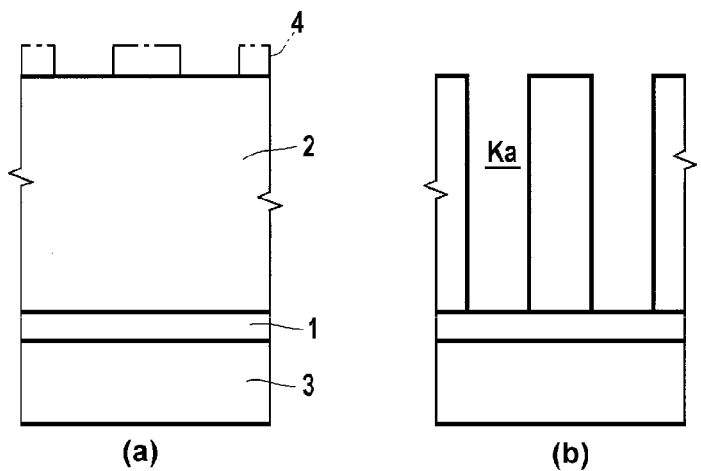
FIG. 2 is a cross-sectional view schematically showing an example of the production step for the capacitor structure that is applied to the present invention.
Figure 3:
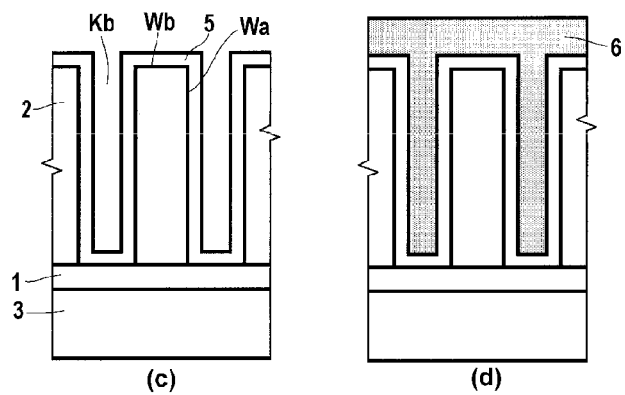
FIG. 3 is a cross-sectional view schematically showing an example of the production step for the capacitor structure that is applied to the present invention (a continuation of FIG. 2).

First, prior to the description of an etching liquid according to the present invention, a production example for a capacitor structure that can be suitably employed in the present invention will be described with reference to the accompanying drawings. It should be noted that in the following detailed description, a formation of the capacitor structure which is a preferable target to be applied in the etching method of the present invention is primarily described, but the present invention is not interpreted as being limited to this embodiment.

(Step a)

In the production example of the present embodiment, a first molded film 1 and a second molded film 2 are formed on a silicon wafer 3. The first molded film 1 is a film which serves as an etching stopper film at the time of boring a cylinder bore, and has an etching rate ratio with the second molded film 2 in an anisotropic dry etching process. An example of the first molded film 1 may be a nitride film formed by an LP-CVD (Low-Pressure Chemical Vapor Deposition) process. On the other hand, in the present embodiment, a polycrystalline silicon or amorphous silicon film is employed in the second molded film 2. Although not depicted, a protective film may also be provided on the silicon wafer 3.

Although the silicon wafer 3 is shown as a single layer in a substantially simplified manner, a predetermined circuit structure is usually formed thereon. For example, a separation insulating film, a gate oxide film, a gate electrode, a diffusion layer region, a polysilicon plug, a silicon oxide film, a silicon nitride film, a bit line, a metal plug, a nitride film, a plasma oxide film, a borophosphosilicate glass (BPSG) film or the like may be used on the silicon wafer 3 (see, for example, Patent Literature 1). In FIGS. 2 to 6, although not particularly indicated with hatched areas, the views show the cross-sections of various members.

(Step b)

Subsequently, a photoresist 4 is patterned by performing a photolithographic process, and a bore is formed by anisotropic dry etching (concave portion Ka). In regard to the photoresist 4 and the technique of dry etching in this case, conventional materials or methods that are applied to this type of product may be applied.

(Step c) and (Step d)

Further, after boring, along a wall surface Wa of the concave portion Ka and an upper surface Wb of the second molded film (silicon film) 2, a conductive film 5 which comprises TiN, and an embedded film 6 (for example, a polycrystalline silicon or amorphous silicon film) for protecting the conductive film 5 are film-formed serially. At this time, a concave portion which is intermediately formed (after formation of the conductive film 5) is indicated as Kb.

(Step e) and (Step f)

Figure 4:
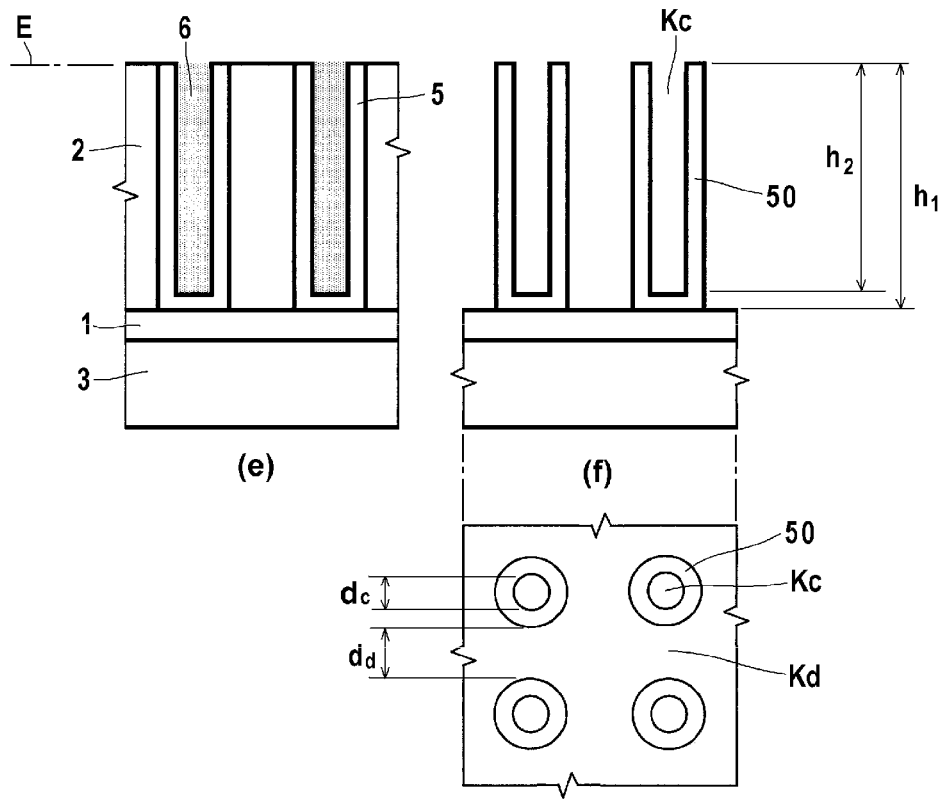
FIG. 4 is a cross-sectional view schematically showing an example of the production step for the capacitor structure that is applied to the present invention (a continuation of FIG. 3).
Figure 5:
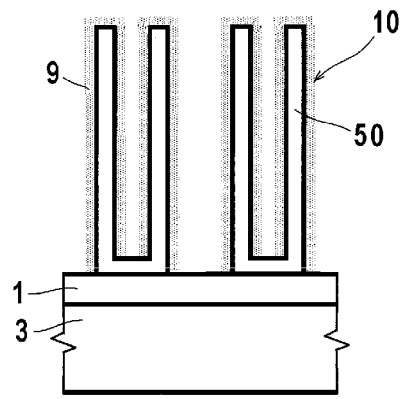
FIG. 5 is a cross-sectional view schematically showing an example of the production step for the capacitor structure that is applied to the present invention (a continuation of FIG. 4).

After the embedded film 6 is formed, portions of the embedded film 6 and the conductive film 5 (FIG. 3, 3) on the wafer surface are removed by CMP (Chemical Mechanical Polishing), until the etch-back line E is exposed. Here, the second molded film 2 and the embedded film 6 are removed by wet etching. In the present invention, this step is important, and the etching liquid according to the present invention that will be described below exhibits excellent effects. Through this step, a lower electrode (cylinder wall) 50 of a capacitor having a cylinder bore Kc is formed (FIG. 4). The depth $h_2$ of the cylinder bore-wall is not particularly limited. In consideration of ordinary structures which this type of the device has, however, a range of 500 to 2,000 nm is practical. It should be noted that the etching liquid of the present invention is preferably applied onto the surface smoothed by the etchback or the like as described above, and that the embedded film is preferably removed from it to form a trench structure.

(Step g)

After the formation of the lower electrode 50 of the capacitor formed as described above, a capacitive insulating film 9 is formed, and then the formation of a plate electrode (upper electrode) (not depicted) is subsequently implemented. Thus, a capacitor structure 10 can be formed. It should be noted that the capacitor structure as used herein may be a capacitor itself, or may be a structural unit constituting a portion of a capacitor. In the example shown in FIG. 5, the capacitor structure 10 is illustrated to be composed of a lower electrode 50 and a capacitive insulating film 9. It should be noted that in the depicted capacitor structure, a constitution in which the lower electrode 50 and a wafer 3 are separated by a molded film 1 is shown. However, if needed, an interpretation of the constitution in which both elements are connected electrically at the cross-section or other positions in the same figure may be permitted. For example, it may be a configuration such that a plug structure or a damascene structure is formed at the portion of the molded film 1 to ensure conduction, or a configuration such that the lower electrode 50 has been formed in a manner that would penetrate through the molded film 1. Further, a capacitive insulating film 9 may be formed not only on the lower electrode 50, but also on other substrate surface.

Figure 6:
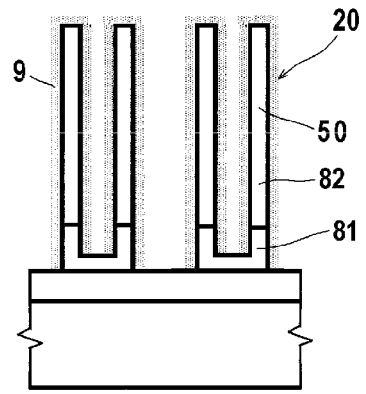
FIG. 6 is a cross-sectional view schematically showing another example of the capacitor structure that is applied to the present invention.

FIG. 6 shows a variation example of the capacitor structure of the embodiment described above. In this example, a bottom area 81 and a main area 82 of the lower electrode (cylinder structure) are formed of different materials. For example, an example may be taken, in which the bottom area 81 is formed of $Si_3N_4$ and the main area 82 is formed of TiN.

(Step a')

Figure 7:
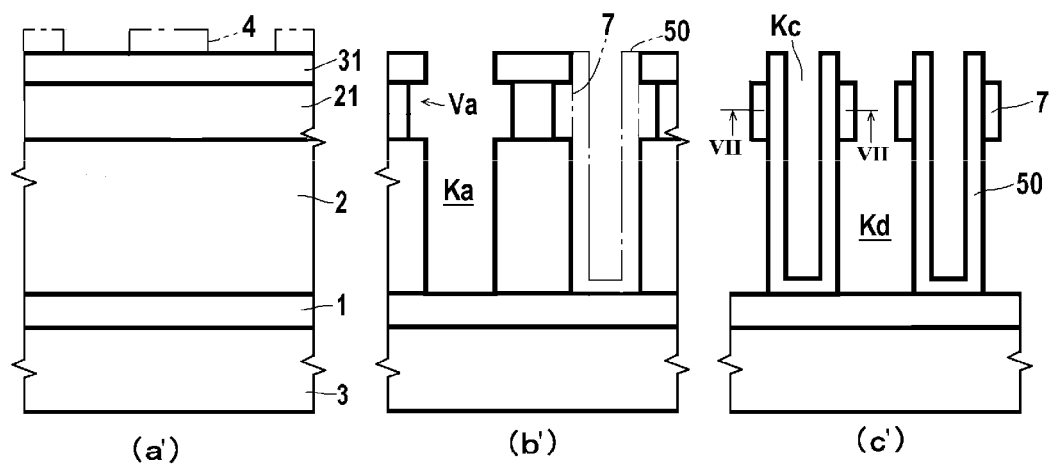
FIG. 7 is a cross-sectional view schematically showing another example of the production step for the capacitor structure that is applied to the present invention.

FIG. 7 shows a variation example of a manufacturing example in the above-described embodiment. A first molded film 1, a second molded film 2, a third molded film 21 and a fourth molded film 31 are formed on a silicon wafer 3 in this order. The first molded film 1 is a film which serves as an etching stopper film at the time of boring a cylinder bore, and the second molded film 2 has an etching rate ratio in an anisotropic dry etching process. An example of the first molded film 1 may be a nitride film formed by an LP-CVD process. It is preferred that the second molded film 2, the third molded film 21 and the fourth molded film 31 be a combination of the films which do not have an etching rate ratio in an anisotropic dry etching but can obtain the etching rate ratio in an isotropic dry etching, and it is more preferred that when a capacitor is formed, the second molded film 2, the third molded film 21 and the fourth molded film 31 be formed by films which can be removed at a time with the same wet etching liquid.

Figure 8:
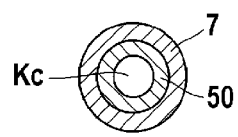
FIG. 8 is a cross-sectional view taken from the arrow direction of the VII-VII line shown in FIG. 7.

As for the etching rate ratio in an isotropic dry etching, it is preferred that the second molded film 2 and the fourth molded film 31 have an equivalent etching rate and the third molded film 21 be a film that has an etching rate larger than those of the second molded film 2 and the fourth molded film 31 respectively. Further, in relation to the second molded film 2 and the fourth molded film 31, the same film may be applied, or different films may be applied. Further, although not depicted, a protective film may be provided. It should be noted that although the silicon wafer 3 is shown as a single layer in a substantially simplified manner, ordinarily a predetermined circuit structure is formed thereon as described above. Further, in FIG. 7, although not particularly indicated with hatched areas, the view shows the cross-sections of various members. FIG. 8 shows a plane section view with hatched areas.

(Step b')

Subsequently, a photoresist 4 is patterned by performing a photolithographic process, and a bore is formed by anisotropic dry etching (concave portion Ka). In regard to the photoresist 4 and the technique of dry etching in this case, conventional materials or methods that are applied to this type of product may be applied.

After boring, an isotropic etching is carried out, a concave portion Va is formed at the portion of the third molded film 21, and then an electrode protective film 7 is allowed to grow. The electrode protective film 7 is preferably a molded film having a sufficient etching rate ratio with respect to the etching liquid to be used for removing the second molded film 2, the third molded film 21 and the fourth molded film 31 at the time of forming a capacitor, and more preferably a film which can be molded uniformly over the concave portion Ka and also is able to embed completely a concave portion 7 formed halfway up the concave portion Ka. Examples thereof include a nitride film and a tantalum pentoxide (Ta2O5) film which are prepared using an ALD (Atomic Layer Deposition) method.

After the electrode protective film 7 grows, the electrode protective film 7 is removed by etching. At this time, an electrode protective film 7 inside the concave portion Va remains without the removal thereof.

(Step c')

In the same manner as the above-described Steps (c) to (g), a lower electrode (cylinder wall) 50 of the capacitor having a cylinder bore Kc is formed. In the same manner as the above-described manufacturing examples, after the formation of the lower electrode 50 of the capacitor formed, a capacitive insulating film 9 is formed, and then the formation of a plate electrode (upper electrode) (not depicted) is subsequently implemented. Thus, a capacitor structure can be formed. It should be noted that the capacitor structure as used herein may be a capacitor itself, or may be a structural unit constituting a portion of a capacitor.

[Silicon Etching Liquid]

Next, a preferred embodiment of the silicon etching liquid of the present invention that can be very effectively used in the wet etching described in connection with the Step e will be described.

The etching liquid in the present invention is characterized in that a quaternary ammonium hydroxide is contained therein in a specific amount. Specifically, it is indispensable that a content of the quaternary ammonium hydroxide is 7% by mass or more and 25% by mass or less. The content of 9% by mass or more is preferred. By setting the content to this lower limit or more, an extremely effective etching power can be brought out in a high-temperature etching as described below.

The upper limit is not particularly limited. However, if this quantity is excessive, increase in etching effects reaches a ceiling or, to the contrary, the effects decrease. Therefore, limitation to moderate amount is preferred. Specifically, the amount of a quaternary ammonium hydroxide is limited to preferably 18% by mass or less, and more preferably 15% by mass or less.

As to the etching liquid of the present invention, it is preferred that solution preparation and etching treatment be carried out in the form which prevents carbon dioxide commingling into the liquid by an inert gas or the like. This is because a pH of the solution becomes acidic due to commingling of carbon dioxide and resultantly etching is reduced, and therefore is aimed at preventing this reduction. A $CO_2$ concentration in the solution is preferably controlled to 1 ppm (mass standard) or less, and more preferably controlled to 0.1 ppm or less. A lower limit of the $CO_2$ concentration is not particularly limited. Given the inevitable amount of commingling, however, it is practical that the lower limit is 0.001 ppm or more.

Quaternary Ammonium Hydroxide

As for the quaternary ammonium hydroxide, a tetraalkyl ammonium hydroxide is preferred. Examples thereof include tetramethyl ammonium hydroxide (TMAH), tetraethyl ammonium hydroxide (TEAH), benzyltrimethyl ammonium hydroxide, ethyltrimethyl ammonium hydroxide, 2-hydroxyethyltrimethyl ammonium hydroxide, benzyltriethyl ammonium hydroxide, hexadecyltrimethyl ammonium hydroxide, tetrabutyl ammonium hydroxide, tetrahexyl ammonium hydroxide, and tetrapropyl ammonium hydroxide.

A tetraalkyl ammonium hydroxide having 3 or more methyl groups and/or ethyl groups is more preferred. Most preferred is tetramethyl ammonium hydroxide or ethyltrimethyl ammonium hydroxide.

The tetraalkyl ammonium hydroxide may be used in combination of plural kinds thereof. However, a limited use of only one kind thereof is preferred. By using only one kind of the quaternary ammonium hydroxide as just described, the composition of the treating solution can be simplified, and a sharp etching effect can be obtained. It should be noted that the treating solution is preferred in simpler composition thereof, and it is preferred that two or more kinds of the quaternary ammonium hydroxide are not used in combination as described above and other additives are not used, and preferred is a substantially binary system comprising one kind of the quaternary ammonium hydroxide and water, or a substantially three-way system comprising TMAH, one kind of the quaternary ammonium hydroxide and a metal masking agent.

The etching liquid of the present invention may contain other components within a range that does not undermine the effect of present invention. For example, incorporation of about 1 ppm of inevitable impurities (organic salts, inorganic salts, and the like) is allowed. However, as shown in Reference Example, it is preferred that a component which has activity as a chemical liquid, but decreases a chemical liquid life, is not contained. Specifically, a content of hydroxylamine is preferably limited to 1 ppm or less, even if it is present, and absolutely no incorporation thereof is more preferred.

[Method for Using]

In the present invention, a solution (chemical liquid) of a quaternary ammonium hydroxide is heated at 80° C. or higher and then applied onto a polycrystalline silicon film or an amorphous silicon film (hereinafter, may be referred to simply as "silicon film"). The above-described applied temperature is preferably 82° C. or higher, more preferably 85° C. or higher, and particularly preferably 90° C. or higher. By raising the temperature, an etching rate can be improved. The upper limit is not particularly limited. In consideration of the chemical liquid containing water, however, it is preferably equal to or lower than its boiling point, more preferably 99° C. or lower, and particularly preferably 95° C. or lower. It should be noted that this temperature indicates that of a supply tank at the time when an etching liquid is applied, if not otherwise specified. It should be noted that the temperature of the etching liquid in the tank shall be determined in accordance with the condition of measurement in Examples described below, if not otherwise specified.

In the present invention, in the case of using single wafer processing equipment, it is preferred that a heating temperature in a heating tank of the chemical liquid and/or a heating temperature in an inline be set to the above-described specific temperature, and this is discharged to bring into contact with a silicon film. Besides, in the case of using a batch-type bath, it is preferred that a temperature of an etching bath is set to the above-described specific temperature, and a silicon film is immersed therein to carry out an etching treatment.

In any event, in the etching of the amorphous silicon film, it is preferred that a pretreatment which removes an oxide film by a hydrofluoric acid aqueous solution or the like be omitted, and it is also preferred that a temperature of the chemical liquid in a tank and/or an inline, or a bath temperature for the etching be set to 82° C. or higher.

In the case of single wafer processing equipment, as the temperature on the wafer becomes higher, the etching rate becomes preferably faster, and to be 70° C. or higher is preferred, and to be 75° C. or higher is more preferred. Particularly preferred is 80° C. or higher. When a treatment at a higher temperature is taken into consideration, it is preferred that the temperature on the wafer be set to a higher temperature range. Specifically, it is preferred that the temperature on the wafer be set to 80° C. or higher, more preferably to 82° C. or higher, and particularly preferably to 85° C. or higher. There is no particular upper limit. However, it is preferred that the temperature be set to 99° C. or lower, and particularly preferably to 95° C. or lower. In order to set it to the above-described temperature range, warming inside of the etching room may be carried out, or a wafer may be heated. It should be noted that the temperature on the wafer shall be determined in accordance with the condition of measurement in Examples described below, if not otherwise specified.

The present invention is more suitable for a method of treating one by one using single wafer processing equipment than a batch method in which the chemical liquid is contained in an etching bath and a wafer is immersed therein.

Figure 9:
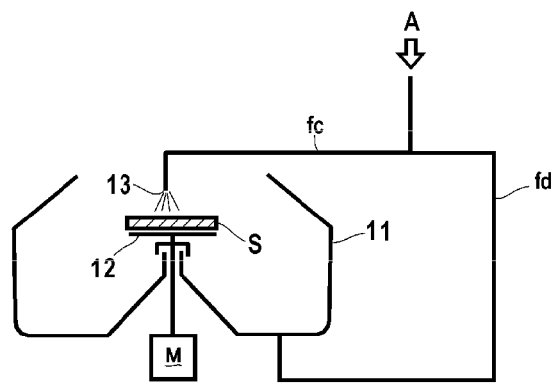
FIG. 9 is a configuration diagram showing a part of the removal equipment relating to a preferable embodiment of the present invention.

FIG. 9 is a configuration diagram showing single wafer processing equipment which may favorably be used in the present invention. The removal treatment of the present embodiment is explained below using this figure. The treatment is constituted so that the prepared etching liquid (liquid composition) is supplied from a supply section A, and then transferred to a discharge outlet 13 through a flow channel fc. Then, a remover is sprayed from the discharge outlet 13, and applied onto an upper surface of a semiconductor substrate S in a reaction container 11. A flow channel fd indicates a return channel for reusing the chemical liquid. In the present embodiment, the semiconductor substrate S is laid on a rotating table 12 and rotated together with the rotating table by a rotary drive member M.

[Supply System and Heating]

In the present invention, although the heated chemical liquid supply line system is not particularly limited, preferable examples thereof are described below.

Examples of Chemical Liquid Supply Line 1) a) Chemical liquid storage tank→b) Heating tank→c) Inline heating→d) Discharge to wafer→Return to a) or b).
2) a) Chemical liquid tank→b) Heating tank→d) Discharge to wafer→Return to a) or b).
3) a) Chemical liquid tank→c) Inline heating→d) Discharge to wafer→Return to a).
4) a) Chemical liquid tank→b) Heating tank→e) Etching bath (Circulating-heating).
5) a) Chemical liquid tank→e) Etching bath (Circulating-heating).
6) b) Heating tank→d) Discharge to wafer→Return to b).
7) b) Heating tank→c) Inline heating→d) Discharge to wafer→Return to b).
8) b) Heating tank→e) Etching bath (Circulating-heating).

The above methods are used.

The chemical liquid already used in the method of the present invention can be re-used by circulation. Preferable method is not "free-flowing" (without re-use), but re-use by circulation. It is possible to continue circulation for 1 hour or longer after heating, which makes it possible to perform a repetitive etching. Although there is no particular upper time limit of the circulating-reheating, exchange within a week is preferable because etching rate deteriorates with time. The exchange within 3 days is more preferable. An exchange to a fresh solution once a day is particularly preferable. Further, an alkaline chemical liquid is preferably used in a sealed system as much as possible, or used with a nitrogen flow because it has the property to absorb carbon dioxide. The nitrogen flow is more preferred. Further, in the etching of the above-described line system, the measurement position of the heating temperature of the above chemical liquid may be determined appropriately in terms of the relation to a line configuration or a wafer. Typically, the measurement position is regulated by adjusting the tank temperature. In the case where relatively more severe conditions in terms of performance are required, wherever the measurement and the regulation are feasible, the temperature-regulated temperature may be defined by a wafer surface temperature.

Preferable variation examples of the present invention are explained below.

In the production method of the present invention, it is preferred that the above-described etching be carried out after a cleaning step of the semiconductor substrate with ultrapure water, a removing step of the silicon dioxide film, and a follow-up cleaning step of the semiconductor substrate with ultrapure water. This promises an effect of reduction in defects (remainder of the residue, imperfection, particle and the like). Further, it is also preferred from the same viewpoint that an aqueous cleaning is carried out using warmed ultrapure water (for example, 50 to 80° C.) after the removing step of the silicon dioxide film. Further, it is also preferred from the same viewpoint that after the above-described follow-up cleaning step with ultrapure water, a wafer is preheated (for example, 50 to 80° C. in terms of wafer surface temperature), and then the above-described etching is carried out. As for the ultrapure water, nitrogen-substituted ultrapure water is preferred.

In the present invention, as described above, the etching is preferably carried out by any of the following processes A and B.

[A: discharging the above-described aqueous solution having the above-described specific temperature in a heating tank and/or by inline system to bring the aqueous solution into contact with the above-described silicon film]

[B: setting the above-described aqueous solution in a bath to the above-described specific temperature and immersing the above-described silicon film in the aqueous solution to bring the aqueous solution into contact with the above-described silicon film]

In the above-described process A, the etching is preferably carried out at 1,000 rpm or more of number of revolutions of the semiconductor substrate. Further, in the above-described process A, the etching is also preferably carried out while translating a chemical liquid nozzle by 2 cm or more from a center of the semiconductor substrate at a rate of 20 reciprocations/minute or more. This promises an effect of improvement in in-plane homogeneity.

[Additives]

In the chemical liquid used in the present invention, additives other than a quaternary alkyl ammonium hydroxide may be incorporated. Examples thereof include a metal-masking agent, an etching accelerator, and an etching inhibitor for materials other than silicon. Especially, addition of a metal-masking agent is preferred.

The metal-masking agent to be added is not particularly limited. However, complexans are preferred. Aminopolycarboxylic acids are more preferred, and EDTA (ethylenediamine tetraacetic acid), DTPA (diethylenetriamine pentaacetic acid), and CyDTA (cyclohexanediamine tetraacetic acid) are still more preferred.

As an addition amount, incorporation of 0.00001 to 1% by mass is preferred, and incorporation of 0.0001 to 0.1% by mass is more preferred.

Application of the present invention made it possible to precisely carry out removal of a polycrystalline silicon film or an amorphous silicon film for formation of a capacitor structure having a concave-convex shape as described above, without injuring members including an electrode and the like.

Generally as the temperature increases, the solubility tends to increase. However, the order of solubility does not always accord with the order of the rate of dissolution. The degree of increase in solubility varies depending on materials. Solubility of salt (sodium chloride) and the like increases to a minor extent, whereas that of alum (aluminum potassium sulfate) rapidly increases depending on temperature. Solubility of polycrystalline silicon and that of amorphous silicon used in the present invention are substantially equal and the solubilities rapidly increase as the temperature increases. However, there is a difference in rate of dissolution between them, and the rate of dissolution of polycrystalline silicon in an alkali solution is generally faster than the other. However, in spite of the difference, the method of the present invention makes it possible to precisely carry out a removal of the silicon film without distinction in process, which provides one of advantages of the present invention.

It should be noted that the solution containing a specific agent or the combined solution thereof, in the present specification, incorporates a meaning as a kit in which respective agents or solutions containing the same before use are mixed to use, in addition to a meaning of a solution composition containing the specific agent.

(pH)

The silicon etching liquid of the present invention is alkaline, and it is preferable that the etching liquid is adjusted to a pH of 11 or higher. The adjustment may be carried out by adjusting amounts of the above-described alkali compound and other additives. However, pH may be set to the above range using another pH controlling agent, as long as it does not undermine the effect of the present invention. The pH of the silicon etching liquid is preferably 12 or higher, and more preferably 13 or higher. When the pH is controlled to the above-described lower limit or higher, a sufficient etching rate can be obtained. Although there is no particular upper limit to the pH, it is practical that the pH is 14 or lower. In the present invention, the pH is a value obtained by measurement at room temperature (25° C.) using F-51 (trade name, manufactured by HORIBA, Ltd.), unless it is explicitly stated otherwise.

(Aqueous Medium)

The etching liquid of the present embodiment is preferably a water-based solution composition (aqueous solution) in which an aqueous medium is contained as a medium. The term "aqueous medium" is referred to water and an aqueous solution in which a water-soluble solute is dissolved in water. Examples of the solute herein described include alcohols and salts of inorganic compounds. Even in the case where the solute is used, however, it is preferable that the amount of the solute be controlled to the range in which a desirable effect is produced. Further, the term "water-based composition" or "aqueous solution" refers to a composition in which water is a main medium. More than a half of the medium other than solid contents is preferably water, more preferably 80% by mass or more thereof, and particularly preferably 85% by mass or more thereof.

On the basis that the etching liquid in the present embodiment is intended to be used in semiconductor fields, it is preferable that various kinds of impurities in the etching liquid be reduced as much as possible. Impurities of which reduction is preferred include metals, various kinds of particles and the like.

(Container)

The etching liquid of the present invention may be stored, transported, and used by filling in an arbitrary container, as long as it does not cause a problem of corrosive properties. Further, for semiconductor application, it is preferred that the container have high cleanness and less elution of impurities therefrom. Examples of available containers include "CLEAN BOTTLE" series manufactured by AICELLO CORPORATION, and "PURE BOTTLE" manufactured by KODAMA PLASTICS Co., Ltd. However, the present invention is not limited to these.

(Silicon Substrate-Surface Treatment)

In the present embodiment, particularly in relation to an amorphous silicon film, it is preferred that the application be carried out without combining with a removal treatment of an oxide film which is spontaneously formed on the silicon substrate surface. This avoids the necessity of applying it before application of the above-described etching liquid. Accordingly, this leads to time shortening. A method of surface treatment is not limited, as long as a formed oxide film is removed, and examples thereof include a method of treating with an acidic aqueous solution containing a fluorine atom. The acidic aqueous solution containing a fluorine atom is preferably hydrofluoric acid, and a content of hydrofluoric acid is preferably a range of about 0.1 to about 5% by mass, and more preferably a range of 0.5 to about 1.5% by mass.

It should be noted that the semiconductor substrate in the present specification is used in the sense of encompassing not only a wafer, but also the entire substrate structure having a circuit structure provided thereon. The semiconductor substrate member indicates members which constitute the semiconductor substrate defined as described above, and may be composed of one material, or may be composed of plural materials. Further, it should be noted that a processed semiconductor substrate may be sometimes called distinctively as a semiconductor substrate product. For further distinction, if needed, a chip taken out by dicing after giving a processing to this, and its processed product are referred to as a semiconductor element. That is to say, in a broad sense, the semiconductor element belongs to the semiconductor substrate product.

(Object to be Processed)

The material that is etched by applying the etching liquid of the present embodiment may be any material, but as a substrate material generally used in the production of capacitors, polycrystalline silicon or amorphous silicon may be exemplified. On the other hand, an example of the electrode material constituting the core of the capacitor structure may be a Ti compound such as titanium nitride (TiN) (However, the present invention is not limited only to an electrode material and may include an etching embodiment of leaving a part of a substrate-constituting member including TiN). That is, the etching liquid of the present embodiment is preferably such that the ratio of the etching rate of the substrate material (ERs) and the etching rate of the electrode material or the like (ERe), (ERs/ERe) is high. The specific value of the ratio is dependent on the type or structure of the material and is not particularly limited. However, the ratio ERs/ERe is preferably 100 or more, and more preferably 200 or more. There is no particular upper limit to this. However, being 10,000 or less is practical.

In the present specification, use of the etching liquid so as to etch a silicon substrate is referred to as "application," but the embodiment is not particularly limited. For example, batch type etching may be carried out through immersion, or single wafer processing type etching may also be carried out through discharge. It should be noted that the Ti compound has a meaning including Ti itself and a compound containing the same. Examples thereof include TiN, and, in addition thereto, Ti and further a composite compound of Ti, N and C. Especially, TiN is preferred.

There are no particular limitations on the shape or dimension of the capacitor structure to be processed. To take an example of a capacitor structure having a cylindrical structure as described above, when the aspect ratio of the cylinder bore is 5 or more, the superior effect of the etching liquid of the present embodiment is particularly appropriately exhibited, and thus it is preferable. From a similar viewpoint, the aspect ratio is preferably 10 or more, more preferably 15 or more, and further more preferably 20 or more. There is no particular upper limit. However, an aspect ratio of 100 or less is practical. The opening diameter $d_c$ of the cylinder bore is not particularly limited, but from the viewpoint of allowing the effect of the present embodiment to be manifested and considering the recent tendency for miniaturization of capacitor structures, the opening diameter is preferably 20 to 80 nm. It should be noted that the trench or its structure in the present specification is a concept including a cylinder structure, and there is no particular limitation, as long as it has a structure which presents a concave form in a specific cross section, and it may be not only a groove-like shape, but also, for example, a pore-like shape, or reversely, a surrounding area at which many needle-shaped structure divisions are projected. When explained taking FIG. 4 as an example, a concave portion Kd corresponds to a trench structure composed of the surrounding area at which many needle-shaped structure divisions are projected, and a cylinder bore Kc corresponds to a pore-like trench structure. An aspect ratio, in the case of the cylinder bore Kc, is a value obtained by dividing a depth $h_2$ by a width dc of the concave portion. An aspect ratio of the concave portion $K_d$, composed of the surrounding area at which many needle-shaped structure divisions are projected, is a value obtained by dividing a depth $h_1$ by, for example, a width $d_d$ of the concave portion.

The significant point to be further emphasized here is that etching property of the capacitor structure, according to the present invention, is realized uniformly at the edges and the center of a wafer. To explain this in terms of the etching rate, the ratio of the etching rate at the edges, Re, and the etching rate at the center, Rc, (Rc/Re), is preferably 0.7 to 1.5, and more preferably 0.85 to 1.15. This can contribute to the realization of a balance between high manufacturing quality and high production efficiency which have been demanded recently, and therefore, it is preferable.

Further, in the present invention, it is desirable from the above-described viewpoints to etch the above-described polycrystalline silicon film or amorphous silicon film while leaving at least a capacitor-constituting member containing TiN at a wall surface of the above-described concave-convex structure. This constituting member may contain HfOx, SiN, $SiO_2$ or the like, in addition to TiN. It should be noted that TiN typically forms an electrode film. Further, it is desirable to provide a semiconductor substrate with a substantially flat surface having the above-described polycrystalline silicon film or amorphous silicon film, and then to apply the above-described etching liquid onto the surface of the semiconductor substrate to remove the above-described polycrystalline silicon film or amorphous silicon film, and to use the thus-removed portion as a concave portion, and to use a convex portion left in the substrate as a capacitor. At this time, it is preferred that a TiN film remains at a wall surface of the above-described concave portion. That is, according to the etching liquid of the preferable embodiment of the present invention, if needed, it is able to respond to a capacitor structure constituted by an electrode having a cylinder structure, and the etching liquid is able to remove selectively a polycrystalline silicon film or an amorphous silicon film inside of the cylinder bore or the like (including outside of the bore at the portion which is densely packed with cylinder structures).

Step requirements for a preferable method of producing a semiconductor substrate product in the present invention are described below.

(1) The method includes a step of preparing a semiconductor substrate having a silicon film comprising a polycrystalline silicon film or an amorphous silicon film, and a step of applying a specific etching liquid onto the above-described semiconductor substrate to etch at least a part of the above-described silicon film.

(2) In the step of preparing the semiconductor substrate, the step includes previously forming a multilayer film structure including the above-described silicon film and forming a concave-convex in the above-described semiconductor substrate, and the method includes subsequent steps:

a step of forming a conductive film at least on the upper surface of the above-described concave-convex surface and on the wall surface of the concave portion;

a step of applying an embedded film onto the above-described conductive film to fill the above-described concave portion with the embedded film; and a step of removing a part of the conductive film portion applied onto the above-described upper surface and the above-described embedded film to expose the silicon film of the above-described semiconductor substrate, and after that, in the etching step of the above-described silicon film, the step includes applying the above-described etching liquid onto the above-described semiconductor substrate to remove the above-described exposed silicon film and the above-described embedded film while leaving the conductive film on the wall surface of the above-described concave portion.

(3) The method includes providing one having a substantially flat surface as a semiconductor substrate, and applying the above-described etching liquid onto the surface of the semiconductor substrate to remove the above-described silicon film and the above-described embedded film, and using the thus-removed portion as a concave portion, and using a convex portion containing the above-described conductive film left in the substrate as an electrode of the capacitor.

EXAMPLES

Example 1 and Comparative Example 1

Polycrystalline Silicon

Etching liquids were prepared by incorporating therein the components shown in the following Table 1 with the compositions (% by mass) shown in the following formula. It should be noted that the pH of each of the etching liquids in Test Nos. 101 to 111 was 13 or higher. FIG. 1 attached herewith shows a relation between a concentration of the chemical liquid and the etching rate. It is understood that the etching rate is almost saturated as a concentration of a quaternary ammonium hydroxide (tetramethyl ammonium hydroxide) becomes 7% or higher. Besides, an addition amount of less than 7% is not desirable because a slight difference in concentration causes a significant change of the etching rate. On the other hand, it was confirmed that if a concentration of TMAH is too high, the etching rate is lowered. It can be inferred that this cause is due to a high-ionic strength in an aqueous solution whereby a rate of dissolution of silicon hydroxide from a wafer surface has been reduced.

<Etching Test>

Test wafer: A wafer having a polycrystalline silicon wafer having a thickness of 1,000 nm formed on single-crystalline <100> silicon was provided. This was subjected to a pretreatment with a 0.5% hydrofluoric acid solution (23° C., 2 L/min, 500 rpm, 1 minute), and then washed sufficiently with pure water (23° C., 2 L/min, 500 rpm, 30 seconds) using single wafer processing equipment (POLOS (trade name), manufactured by SPS-Europe B.V.). After removing the water completely by rotation with 2,000 rpm for 30 seconds, etching was carried out under the following conditions, and evaluation tests were carried out. Meanwhile, a wafer with the diameter of 300 mm was used, and its average etching rate (Ave) was evaluated by an ellipsometry (film-thickness measuring method using a spectroscopic ellipsometer). Measurement was carried out with respect to 5 points which were evenly split between the center of the wafer and an edge thereof, and evaluation was carried out based on the results of these 5 points.

Next, 5 sheets of wafer were subjected to etching treatment using the same chemical liquid, and thereafter a recovered solution was placed again in a tank, and then etching tests were carried out again. The defect number of the wafer surface was counted under an optical microscope. The number of defects (number of portions in which a residue is remaining) existing in a 1 cm×1 cm square area was shown in Table. The single wafer processing equipment was configured in a form as shown in FIG. 9.

(Measuring Method of Treatment Temperature)

Temperature of Etching Liquid in Tank

As for a method of measuring a solution temperature in tank, it is possible to use a digital thermometer in which the surface of the thermocouple sensor is coated with TEFLON (registered trademark). In this test, TE-PT-PFA-1.0×1.6, manufactured by TOHO ELECTRONICS INC., was used. The TEFLON (registered trademark)-coated thermometer has a slow responsiveness. Therefore, for precise measurement, the temperature is preferably read at least 5 minutes later after the temperature has become constant.

Temperature on Wafer

A radiation thermometer IT-550F (trade name) manufactured by HORIBA, Ltd. was fixed at the height of 30 cm above a wafer in the above-described single wafer processing equipment. Pointing a thermometer at a wafer surface 2 cm outside the wafer center, a temperature was measured while streaming with a chemical liquid. The temperature was digitally read out from the radiation thermometer to record it continuously by using a personal computer. The temperature on the wafer was based on an average of the temperature for 10 seconds during which the temperature has become stable among these.

Chemical liquid temperature: described in Table 1
Amount discharged: 2 L/min.
Number of revolutions of wafer: 1,000 rpm

TABLE 1

| Test No. | Alkali Component | (mass %) | Water | T(tank) (° C.) | T(wafer) (° C.) | Rsi (Å/min) | Etching residue in recovered solution |
|---|---|---|---|---|---|---|---|
| 101 | TMAH | 7 | balance | 85 | 81 | 10500 | 1 |
| 102 | TMAH | 7 | balance | 94 | 90 | 14700 | 0 |
| 103 | TMAH | 11 | balance | 85 | 81 | 12300 | 1 |
| 104 | TMAH | 11 | balance | 98 | 94 | 17800 | 0 |
| 105 | TMAH | 15 | balance | 85 | 81 | 12600 | 1 |
| 106 | TMAH | 15 | balance | 94 | 90 | 17500 | 0 |
| 107 | TMAH | 15 | balance | 98 | 94 | 18200 | 0 |
| 108 | TMAH | 20 | balance | 85 | 81 | 12000 | 2 |
| 109 | TMAH | 25 | balance | 85 | 81 | 11300 | 2 |
| 110 | ETMAH | 11 | balance | 98 | 94 | 16900 | 0 |
| 111 | TEAH | 11 | balance | 98 | 94 | 16100 | 0 |
| c11 | TMAH | 2.38 | balance | 85 | 81 | 5300 | 1 |
| c12 | TMAH | 5 | balance | 85 | 81 | 8700 | 1 |
| c13 | TMAH | 11 | balance | 80 | 75 | 5200 | 2 |
| c14 | TMAH | 11 | balance | 74 | 70 | 4300 | 5 |
| c15 | Ammonia | 11 | balance | 85 | 81 | 800 | 0 |
| c16 | Ethanolamine | 11 | balance | 98 | 94 | 1100 | 0 |

Test No. 1**: Examples
Test No. c**: Comparative Examples
TMAH: Tetramethyl ammonium hydroxide
ETMAH: Ethyltrimethyl ammonium hydroxide
TEAH: Tetraethyl ammonium hydroxide
Rsi: Silicon etching rate
T (tank): Etching liquid temperature inside a tank
T (wafer): Wafer surface temperature As shown in the above table, by the silicon etching method of the present invention, sufficient etching rates with respect to the polycrystalline silicon were realized. In addition, it was possible to carry out an etching treatment without unevenness in a wafer surface. Further, it was also confirmed that the silicon etching liquid of the present invention has minimal damage to each film of TiN which is a constituting member such as an electrode material or the like of the element.

In contrast, as for those of Comparative Examples, etching rates were low. Recently, a brief treatment (from 1 minute to 2 minutes) for thick films has been desired. However, these were not suitable for this treatment.

Example 2 and Comparative Example 2

Amorphous Silicon

Evaluation was carried out in the same manner as Example 1, except that the polycrystalline silicon in Example 1 was replaced with amorphous silicon.

TABLE 2

| Test No. | Alkali Component | (mass %) | Water | T(tank) (° C.) | T(wafer) (° C.) | Rsi (Å/min) | Etching residue in recovered solution |
|---|---|---|---|---|---|---|---|
| 201 | TMAH | 7 | balance | 85 | 81 | 4800 | 1 |
| 202 | TMAH | 7 | balance | 94 | 90 | 6700 | 0 |
| 203 | TMAH | 11 | balance | 85 | 81 | 5600 | 1 |
| 204 | TMAH | 11 | balance | 98 | 94 | 8100 | 0 |
| 205 | TMAH | 15 | balance | 85 | 81 | 5700 | 1 |
| 206 | TMAH | 15 | balance | 94 | 90 | 8000 | 0 |
| 207 | TMAH | 15 | balance | 98 | 94 | 8300 | 0 |
| 208 | TMAH | 20 | balance | 85 | 81 | 5500 | 1 |
| 209 | TMAH | 25 | balance | 85 | 81 | 5100 | 1 |
| 210 | ETMAH | 11 | balance | 98 | 94 | 7700 | 0 |
| 211 | TEAH | 11 | balance | 98 | 94 | 7300 | 0 |
| c21 | TMAH | 2.38 | balance | 85 | 81 | 2400 | 1 |
| c22 | TMAH | 5 | balance | 85 | 81 | 4000 | 1 |
| c23 | TMAH | 11 | balance | 79 | 75 | 2400 | 2 |
| c24 | TMAH | 11 | balance | 74 | 70 | 2000 | 2 |
| c25 | Ammonia | 11 | balance | 85 | 81 | 400 | 0 |
| c26 | Ethanolamine | 11 | balance | 98 | 94 | 500 | 0 |

As shown in the above table, by the silicon etching method of the present invention, sufficient etching rates with respect to the amorphous silicon which shows a slow etching rate were also realized.

Example 3 and Comparative Example 3

Amorphous Silicon, without Pretreatment

Evaluation was carried out in the same manner as Example 2, except that the pretreatment with hydrofluoric acid in Example 2 was omitted.

TABLE 3

| Test No. | Alkali Component | (mass %) | Water | T(tank) (° C.) | T(wafer) (° C.) | Rsi (Å/min) | Etching residue in recovered solution |
|---|---|---|---|---|---|---|---|
| 301 | TMAH | 7 | balance | 85 | 81 | 3400 | 0 |
| 302 | TMAH | 7 | balance | 94 | 90 | 4500 | 0 |
| 303 | TMAH | 11 | balance | 85 | 81 | 3800 | 1 |
| 304 | TMAH | 11 | balance | 98 | 94 | 5400 | 0 |
| 305 | TMAH | 15 | balance | 85 | 81 | 4000 | 1 |
| 306 | TMAH | 15 | balance | 94 | 90 | 5300 | 0 |
| 307 | TMAH | 15 | balance | 98 | 94 | 5500 | 0 |
| 308 | TMAH | 20 | balance | 85 | 81 | 3700 | 1 |
| 309 | TMAH | 25 | balance | 85 | 81 | 3500 | 1 |
| 310 | ETMAH | 11 | balance | 94 | 94 | 5100 | 0 |
| 311 | TEAH | 11 | balance | 94 | 94 | 4900 | 0 |
| c31 | TMAH | 2.38 | balance | 85 | 81 | 1600 | 1 |
| c32 | TMAH | 5 | balance | 85 | 81 | 2600 | 1 |
| c33 | TMAH | 11 | balance | 79 | 75 | 1500 | 2 |
| c34 | TMAH | 11 | balance | 74 | 70 | 1300 | 2 |
| c35 | Ammonia | 11 | balance | 85 | 81 | 200 | 0 |
| c36 | Ethanolamine | 11 | balance | 9 | 94 | 300 | 0 |

As shown in the above table, by the silicon etching method of the present invention, fast etching rates with respect to the amorphous silicon were also realized, despite the omission of the pretreatment for removing an oxide film. This rate allows for treatment in a shorter total time than the total time required for a pretreating and then an etching treatment.

Example 4 and Comparative Example 4

Metal Ion+Metal Masking Agent

Each solution in Example 2 was placed in a bath made of TEFLON (registered trademark), and $TiCl_3$ was added so as to be 0.001% by mass of Ti ion and $FeCl_3$ was added so as to be 0.001% by mass of Fe ion. After putting a cover made of TEFLON (registered trademark) on the bath, heating was continued at 90° C. for 1 week while circulating the solution. Evaporated moisture was replenished as needed to keep the solution amount constant. Evaluation was carried out in the same manner as Example 2 using the solution. Further, the defect number within a 1 cm×1 cm square wafer was evaluated by optical microscopic observation. It should be noted that the defect means a defection that is caused on a wafer surface, and specifically it includes residues, scratches, corrosion, particles, and the like.
A: Remaining about the same (1 time or more and less than 2 times)
B: Slight increase (2 times or more and less than 10 times)
C: Apparent increase (10 times or more)

TABLE 4

| Test No. | Alkali Component | (mass %) | Additive Compound | (mass %) | Water | T(tank) (° C.) | Rsi (Å/min) | Defect |
|---|---|---|---|---|---|---|---|---|
| 401 | TMAH | 11 | EDTA | 0.001 | balance | 90 | 7000 | A |
| 402 | TMAH | 11 | EDTA | 0.01 | balance | 90 | 7500 | A |
| 403 | TMAH | 11 | DTPA | 0.001 | balance | 90 | 7200 | A |
| 404 | TMAH | 11 | DTPA | 0.01 | balance | 90 | 7800 | A |
| 405 | TMAH | 11 | — | — | balance | 90 | 6600 | B |

As shown in the above Table, addition of the metal masking agent enabled retention of stable performance even in the case where a metal ion comes to be mixed therein. Further, the addition enabled suppression of a defect.

Reference Example

A chemical liquid s 01 containing 10% by mass of tetramethyl ammonium hydroxide (TMAH) and 10% by mass of hydroxyl amine (HA) was prepared. An etching test of the silicon film was carried out using this liquid in the same manner as Test No. 101 of Example 1. As a result, this exhibited almost equal performances to the chemical liquid of Test No. 101 in terms of etching rate (Rsi) of silicon and defect number (number of the portion in which a residue is left). However, as shown below, it is understood that the chemical liquid s 01 is unfitted for long storage or continuous running because of remarkable deterioration of its activities.

TABLE 5

|  | 101 | s 01 |
|---|---|---|
| Rsi* immediately after solution preparation | 100 | 100 |
| Ordinary temperature after storage for 5 hours | 100 | 96 |
| 80° C. after storage for 5 hours | 99 | 63 |
| 90° C. after storage for 5 hours | 97 | 49 |

*Index Indication • • • the etching rate immediately after solution preparation is defined as 100.

Having described our invention as related to the present embodiments, it is our intention that the invention not be limited by any of the details of the description, unless otherwise specified, but rather be construed broadly within its spirit and scope as set out in the accompanying claims.

REFERENCE SIGNS LIST

1: First insulating film
2: Second insulating film
3: Silicon wafer
4: Photoresist
5: Conductive film
6: Embedded film
7: Protective member
9: Capacitive insulating film
10: Capacitor structure
50: lower electrode (cylinder wall)

The invention claimed is:
1. A method of producing a semiconductor substrate product, the method comprising:
   a step of preparing an aqueous solution containing 7% by mass or more and 15% by mass or less of a quaternary alkyl ammonium hydroxide;
   a step of preparing a semiconductor substrate having a silicon film comprising a polycrystalline silicon film or an amorphous silicon film;
   a step of heating the aqueous solution at 80° C. or higher and applying the resultant aqueous solution onto the semiconductor substrate to etch at least a part of the silicon film;
   a step of forming a multilayer film structure including a silicon film, and forming a concave-convex in the semiconductor substrate, in the step of preparing the semiconductor substrate, then
   a step of forming a conductive film at least on the upper surface of a concave-convex surface and on the wall surface of a concave portion;
   a step of applying an embedded film onto the conductive film to fill the concave portion with the embedded film; and a step of removing a part of the conductive film portion applied on the upper surface and the embedded film to expose the silicon film of the semiconductor substrate, and thereafter, a step of applying the aqueous solution onto the semiconductor substrate to remove the exposed silicon film and the embedded film while leaving the conductive film on the wall surface of the concave portion, as the etching step of the silicon film, wherein the semiconductor substrate comprises a Ti compound, and a portion of the silicon film is etched selectively to the Ti compound.

2. A method of producing a semiconductor substrate product, the method comprising:

a step of preparing an aqueous solution containing 7% by mass or more and 15% by mass or less of a quaternary alkyl ammonium hydroxide;

a step of preparing a semiconductor substrate having a silicon film comprising a polycrystalline silicon film or an amorphous silicon film;

a step of heating the aqueous solution at 80° C. or higher and applying the resultant aqueous solution onto the semiconductor substrate to etch at least a part of the silicon film:

a step of forming a multilayer film structure including a silicon film, and forming a concave-convex in the semiconductor substrate, in the step of preparing the semiconductor substrate, then a step of forming a conductive film at least on the upper surface of a concave-convex surface and on the wall surface of a concave portion;

a step of applying an embedded film onto the conductive film to fill the concave portion with the embedded film; and a step of removing a part of the conductive film portion applied on the upper surface and the embedded film to expose the silicon film of the semiconductor substrate, and thereafter, a step of applying the aqueous solution onto the semiconductor substrate to remove the exposed silicon film and the embedded film while leaving the conductive film on the wall surface of the concave portion, as the etching step of the silicon film, wherein a concave-convex shape that constitutes a capacitor is formed by removing a part or all of the silicon film, and wherein the semiconductor substrate comprises a Ti compound, and a portion of the silicon film is etched selectively to the Ti compound.

3. The method of producing a semiconductor substrate product according to claim 1 or 2, wherein a temperature of the aqueous solution is set to 90° C. or higher.

4. The method of producing a semiconductor substrate product according to claim 1 or 2, wherein the aqueous solution comprises only one kind of the quaternary alkyl ammonium hydroxide.

5. The method of producing a semiconductor substrate product according to claim 1 or 2, wherein the aqueous solution is applied onto the silicon film comprising a polycrystalline silicon film or an amorphous silicon film which is not yet subjected to a removal treatment of an oxide-film.

6. The method of producing a semiconductor substrate product according to claim 1 or 2, wherein application of the aqueous solution onto the silicon film is carried out in an inert atmosphere.

7. The method of producing a semiconductor substrate product according to claim 2, wherein a cylinder structure having an aspect ratio (depth/opening breadth) of 15 to 100 is formed as the concave-convex shape.

8. The method of producing a semiconductor substrate product according to claim 1 or 2, wherein the quaternary alkyl ammonium hydroxide comprises a compound containing 3 or more methyl groups or ethyl groups.

9. The method of producing a semiconductor substrate product according to claim 1 or 2, wherein a metal masking agent is contained in an amount of from 0.0001 to 0.1% by mass.

10. The method of producing a semiconductor substrate product according to claim 1 or 2, wherein the above-described etching is carried out after a cleaning step of the semiconductor substrate with ultrapure water, a removal step of a silicon oxide film, and a follow-up cleaning step of the semiconductor substrate with the ultrapure water.

11. The method of producing a semiconductor substrate product according claim 10, wherein an aqueous cleaning with warmed ultrapure water is carried out after the removal step of the silicon oxide film.

12. The method of producing a semiconductor substrate product according to claim 10, wherein a wafer is pre-heated after the follow-up cleaning step with the ultrapure water, and then subjected to etching.

13. The method of producing a semiconductor substrate product according to claim 10, wherein nitrogen-substituted ultrapure water is used in the cleaning step, the nitrogen-substituted ultrapure water being ultrapure water in which nitrogen is introduced by contact with ambient air that has about 80% nitrogen and about 20% oxygen.

14. The method of producing a semiconductor substrate product according to claim 1 or 2, wherein application of the aqueous solution onto the silicon film is carried out by any of the following processes A and B:

A: discharging the aqueous solution having a specific temperature in a heating tank and/or by an inline system thereby bringing the solution into contact with the silicon film;

B: setting the aqueous solution in a bath to a specific temperature and immersing a silicon film in the aqueous solution thereby bringing the solution into contact with the silicon film.

15. The method of producing a semiconductor substrate product according to claim 14, wherein etching is carried out at 1,000 rpm or more of number of revolutions of the semiconductor substrate in the process A.

16. The method of producing a semiconductor substrate product according to claim 15, wherein etching is carried out while translating a chemical liquid nozzle by 2 cm or more from a center of the semiconductor substrate at a rate of 20 reciprocation/min or more in the process A.

17. The method of producing a semiconductor substrate product according to claim 1 or 2, wherein a temperature of the aqueous solution is controlled by a tank temperature or a wafer surface temperature.

18. The method of producing a semiconductor substrate product according to claim 1 or 2, wherein a concentration of the quaternary alkyl ammonium hydroxide in the aqueous solution is set to 9% by mass or more and 15% by mass or lower.

19. The method of producing a semiconductor substrate product according to claim 1, wherein a ratio (ERs/ERe) of an etching rate (ERs) of the silicon film to an etching rate (ERe) of a titanium compound is set to 100 or more.

20. The method of producing a semiconductor substrate product according to claim 1 or 2, wherein the aqueous solution consists of the quaternary alkyl ammonium hydroxide and water.

21. The method of producing a semiconductor substrate product according to claim 1 or 2, wherein the aqueous solution consists essentially of the quaternary alkyl ammonium hydroxide and water.

* * * * *